United States Patent [19]
Licari et al.

[11] Patent Number: 5,485,038
[45] Date of Patent: Jan. 16, 1996

[54] MICROELECTRONIC CIRCUIT SUBSTRATE STRUCTURE INCLUDING PHOTOIMAGEABLE EPOXY DIELECTRIC LAYERS

[75] Inventors: James J. Licari, Whittier; Deborah J. Smith, Fountain Valley, both of Calif.

[73] Assignee: Hughes Aircraft Company, Los Angeles, Calif.

[21] Appl. No.: 305,492

[22] Filed: Sep. 12, 1994

Related U.S. Application Data

[63] Continuation of Ser. No. 91,583, Jul. 15, 1993, abandoned.

[51] Int. Cl.$^6$ .................................................. H01L 23/48
[52] U.S. Cl. .................. 257/758; 257/702; 257/700; 257/774
[58] Field of Search ............................. 257/686, 702, 257/748, 750, 758, 700, 708

[56] References Cited

U.S. PATENT DOCUMENTS

| | | | |
|---|---|---|---|
| 4,566,186 | 1/1986 | Bauer et al. | 29/852 |
| 5,239,448 | 8/1993 | Perkins et al. | 361/764 |

OTHER PUBLICATIONS

"Thin Flim MCMs, Meeting Advanced CMOS Challenges", Advanced Packaging vol. 1, No. 1, 1992, pp. 46–51.

"Advanced Dispensing and Coating Technologyies for Polyimide Films", by T. Snodgrass et al, Proceedings Fourth DuPont Symposium on High Density Interconnect Technology, Oct. 1–3, 1991, pp. 267–278.

"Photoimageable Solder Masks Revisited", by K. Bullock, Electronic Packaging and Production, Jun. 1992, pp. 40–44.

"Metallic Coating of Plastics", by W. Goldie, vol. 1, Electrochemical Publication Ltd., Middlesex, England, 1968, pp. 59–73.

*Primary Examiner*—Sara W. Crane
*Assistant Examiner*—Nathan Kip Kelley
*Attorney, Agent, or Firm*—H. P. Gortler; M. W. Sales; W. K. Denson-Low

[57] ABSTRACT

A High-Density-Multi-Chip (HDMI) substrate structure (10) includes alternating conductor metallization (24,28,36,54,56) and insulating dielectric layers (14,38). The dielectric layers (14,38) are formed by curtain coating of ultraviolet photoimageable epoxy material, and the metallization (24,28,36,54,56) is formed by electroless plating or sputtering of copper. The dielectric layers (14,38) are photoimaged and developed to form via holes (16,40,44), and vias (18,42,46) are formed in the holes (16,40,44) by electroless copper plating. The metallization (24,28,36,54,56) can be formed in the same manner as the dielectric layers (14,38), or can alternatively be formed by subtractive photolithography using photoresist masks.

7 Claims, 11 Drawing Sheets

MICROELECTRONIC CIRCUIT SUBSTRATE STRUCTURE INCLUDING PHOTOIMAGEABLE EPOXY DIELECTRIC LAYERS

This is a continuation application Ser. No. 08/091,583, filed Jul. 15, 1993.

BACKGROUND OF THE INVENTION

Field of the Invention

The present invention generally relates to the art of microelectronics, and more specifically to a High-Density-Multichip-Interconnect (HDMI) substrate structure including dielectric layers formed of photoimageable epoxy materials.

Description of the Related Art

HDMIs are structures which integrate a supporting substrate with metallization patterns for power and signal interconnects. A conventional HDMI includes a substrate on which one or more integrated microcircuit chips are mounted, and a multilevel structure including alternating patterned metal conductor metallization and dielectric layers.

The conductors layers of gold, aluminum or copper are formed on the dielectric layers by thin film printing, sputtering or plating, and are patterned as lines and planes to provide power and signal interconnections between chips. Vertical interconnects (vias) are formed through the dielectric layers to interconnect the metallization patterns on adjacent conductor layers.

As described in an article entitled "Thin Film MCMs, Meeting Advanced CMOS Challenges" *Advanced Packaging* Vol 1, No. 1, 1992, pp. 46–51, polyimide is conventionally used as the material for the dielectric layers. Although polyimide has various properties, including a dielectric constant of approximately 3.0, which make it a desirable material for HDMI substrates, it is expensive and suffers from other serious drawbacks.

Polyimides must be cured at a relatively high temperature of 350°–400° C., and slow ramping and/or step curing is required to achieve full imidization and to minimize film stress. The stresses created by the high temperature cure can result in wafer breakage, and can also adversely affect electrical performance. Curing is performed either on hot plates or in convection ovens, both of which are low volume batch processes.

Another disadvantage of wet-processed polyimides is their incompatibility with copper, a desirable metallization for high density packaging. Copper diffuses through polyimide which is not preimidized (pre-cured), and has poor adhesion to preimidized polyimide. For this reason, barrier or adhesion layers such as chromium are required between the polyimide and copper layers. Aluminum can alternatively be used as the metallization material, but has lower electrical performance.

Wet spin coating is the conventional method of polyimide layer application. However, it is undesirable in that it wastes approximately 95% of the expensive polyimide material used in the process and is extremely inefficient for shapes other than circular wafers.

A recently developed alternative, as described in an article entitled "ADVANCED DISPENSING AND COATING TECHNOLOGIES FOR POLYIMIDE FILMS", by T. Snodgrass et al, *Proceedings from the Fourth DuPont Symposium on High Density Interconnect Technology*, Oct. 1–3, 1991, pp. 267–278, is liquid extrusion coating. In this method, pressurized liquid polyimide is dispensed onto a moving substrate from a linear orifice. Although extrusion coating is a more desirable application method than spin coating, it does not overcome the disadvantages of the polyimide material itself.

Sputtering and evaporation are the conventional processes for forming metallizations, both of which are high cost vacuum processes and are extremely susceptible to equipment down-time. The throughput time is also long as these processes are limited to small batches and require pump-down for vacuum.

HDMIs using polyimide dielectric layers are highly sensitive to defects, and are conventionally fabricated in a costly clean room environment which is usually reserved for semiconductor fabrication. This is necessary because the wafers must be hand carried between operations, and the geometries of the interconnects are extremely fine.

The conventional polyimide materials used for HDMI fabrication are not photoimageable. Thus, the metallization patterns and interlayer vias must be formed by photolithography, involving applying, imaging, developing and removing a photoresist layer for each metallization and dielectric layer. A large number of process steps are thereby required for each layer.

Although photoimageable polyimides exist, they are either solvent developable (environmentally hazardous) or do not have the required properties. Vias in non-photoimageable polyimides must be formed by plasma or wet etching using photoresist, involving numerous additional process steps. Photoimageable polyimides have the same disadvantages as non-photoimageable polyimides, including high cost, high temperature cure and incompatibility with copper metallization.

Ultraviolet photoimageable epoxy materials have been used as solder masks in printed circuit board applications, as described in an article entitled "Photoimageable Solder Masks Revisited" by K Bullock, *Electronic Packaging and Production*, June, 1992, pp. 40–44. The epoxy solder mask is applied using screen printing or curtain or flow coating, photoimaged, developed, and subsequently cured at a relatively low temperature of approximately 150°–200° C.

Curtain or flow coating can be considered a variation of extrusion coating in that a liquid is caused to flow out of an orifice onto the article being coated. Conventional extrusion coating of materials having relatively high viscosity, including polyimide, require the application of pressure to cause the material to flow out of the orifice. In curtain or flow coating, material is caused to flow out of the orifice by gravity alone. For this reason, curtain or flow coating is only suitable for materials having relatively low viscosity, including ultraviolet photoimageable epoxy materials.

SUMMARY OF THE INVENTION

A High-Density-Multi-Chip (HDMI) substrate structure embodying the present invention includes alternating conductor metallization and insulating dielectric layers. The dielectric layers are formed by screen printing or curtain coating of ultraviolet photoimageable epoxy material, and the metallization layers are formed by electroless plating or sputtering of copper.

The dielectric layers are photoimaged and developed to form via holes, and vias are formed in the holes by electroless copper plating. The metallization layers can be formed in the same manner as the dielectric layers, or can alternatively be formed by subtractive photolithography using photoresist masks.

The photoimageable epoxy materials used as the dielectric layers of the present substrate structure have a dielectric constant on the order of 2.7–4, which is suitable for HDMI applications.

Photoimageable epoxy material is currently an order of magnitude less expensive than the polyimide materials which are conventionally used as interlayer dielectrics in HDMIs, and can be directly patterned to form via holes in accordance with the invention. This eliminates the photoresist coating and patterning steps which are required to form via holes in polyimide materials, and thereby enables the present fabrication method to be performed using a substantially smaller number of steps than the prior art.

The photoimageable epoxy materials can be applied by screen printing or curtain coating and cured in air in a conveyorized furnace at a substantially lower temperature than polyimide materials, thereby eliminating the danger of stress induced damage as is present in the prior art. This reduces the curing time of the dielectric layers, and thereby the fabrication time of the HDMI structure by a considerable extent. The conveyorized curing also gives a much greater throughput capability.

The electroless copper plating process used for forming the vias and conductor metallizations is a non-vacuum, high volume, high throughput process which can be precisely controlled and uses reliable equipment. The entire fabrication can be performed in a less costly cleanroom environment than is required for polyimide based HDMIs, thereby further reducing the processing time and cost.

These and other features and advantages of the present invention will be apparent to those skilled in the art from the following detailed description, take together with the accompanying drawings, in which like reference numerals refer to like parts.

DETAILED DESCRIPTION OF THE INVENTION

Figure 1:
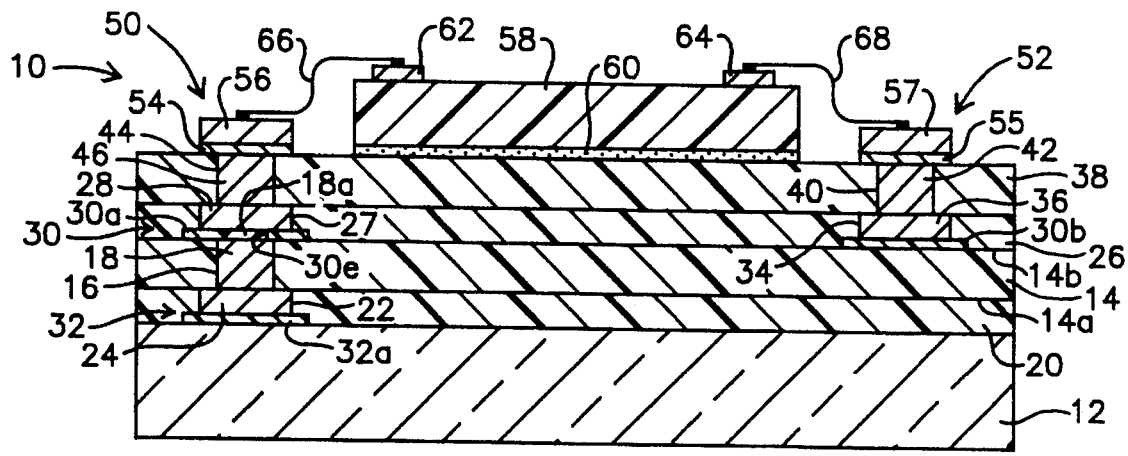
FIG. 1 is a simplified sectional view illustrating a first embodiment of a microelectronic circuit substrate structure embodying the present invention.

As illustrated in FIG. 1, an exemplary HDMI microelectronic circuit substrate structure 10 embodying the present invention includes a substrate 12 formed of alumina, laminated epoxy or plastic, copper, aluminum, ceramic or other suitable electrically conductive or non-conductive material. In applications in which cost reduction is an important factor, low grade (96%) alumina can be used without sacrificing the durability or electrical performance of the structure 10.

Although not illustrated in detail, the substrate 12 can also be a multilayer structure including alternating layers of dielectric and conductor patterns which are interconnected by vias. Examples of such structures are low-temperature-cofired ceramic (LTCC) and aluminum nitride cofired packages and printed circuit laminates. These structures are advantageous since external power, signal and ground plane connections can be incorporated into the substrate 12 rather than being provided between the dielectric layers which are formed on the substrate 12.

A first dielectric layer 14 has a lower first surface 14a and an upper second surface 14b, and a via hole 16 formed therethrough which extends between the surfaces 14a and 14b. An electrically conductive via 18, preferably of copper, is formed in the via hole 16. A second dielectric layer 20 is formed between the first dielectric layer 14 and the substrate 10, and has a hole 22 therethrough. A first electrical metallization or conductor 24, preferably of copper, is formed in the hole 22.

A third dielectric layer 26 is formed on the first dielectric layer 14, and has a hole 27 therethrough. A second electrical metallization or conductor in the form of a catch pad 28, preferably of copper, is formed in the hole 27. The via 18 electrically interconnects the conductor 24 and the catch pad 28.

The dielectric layers 14, 20 and 26 are formed of an ultraviolet photoimageable epoxy material having a dielectric constant on the order of 2.7–4. Suitable materials for the layers 14, 20 and 26 include cycloaliphatic epoxies, epoxy acrylates and other photoimageable epoxies. Specific materials suitable for the layers 14, 20 and 26 include ENPLATE® APR-8829, Photoimageable Plating Resist, manufactured by Enthone-Omi Inc. of New Haven, Conn., and IMAGECURE® XV501T SM SCREEN AQ SOLDERMASK, manufactured by Coates Circuit Products of Bath, England.

Electroless copper will typically not plate onto pure dielectric photoimageable epoxy materials of the type used to practice the invention. For this reason, a first section 30a of a fourth dielectric layer 30 of photoimageable epoxy material containing metal ions is formed between the first dielectric layer 14 and the catch pad 28, and a section 32a of a fifth dielectric layer 32 of photoimageable epoxy material containing metal ions is formed between the conductor 24 and the substrate 12.

The layers 30 and 32 can include the pure dielectric photoimageable epoxy material of the layers 14, 20 and 26 and an electrically conductive metal ion additive to enable plating of electroless copper. The additive preferably includes palladium ions which are uniformly dispersed or filled in the epoxy, or concentrated in the upper surface portion thereof. Alternatively, the layers 30 and 32 can include base layers of pure photoimageable epoxy material with thin palladium ion coatings on the upper surfaces thereof.

A hole 34 is formed in the layer 26, and another electrical conductor 36 is formed in the hole 34, coextensively therewith. A second section 30b of the layer 30 is formed between the conductor 36 and the layer 14. The sections 30a and 30b of the layer 30 and the section 32a of the layer 32 are slightly larger than the catch pad 28 and the conductors 36 and 24 respectively to allow for misalignment error.

Another dielectric layer 38 of photoimageable epoxy material is formed on the layer 26 and has a via hole 40 therethrough. A via 42 is formed in the hole 40 and electrically communicates with the conductor 36. Another via hole 44 is formed through the layer 38. A via 46 is formed in the hole 44 and electrically communicates with the catch pad 28.

Electrically conductive contact pads 50 and 52 are formed on the layer 38, including base layers 54 and 55 and contact layers 56 and 57 respectively. Each of the layers 54, 55, 56 and 57 includes a lower layer of nickel and a upper layer of gold.

The dielectric layers 14 and 38 in which the vias are formed are typically 10-15 micrometers thick. The dielectric layers 20 and 26 in which the conductors are formed are typically 3-5 micrometers thick. The ionized dielectric layers 30 and 32 are typically one micrometer thick.

A microelectronic circuit die or chip 58 or other component is adhered to the layer 38 by an adhesive 60. Bond pads 62 and 64 are formed on the chip 58 and are electrically interconnected with the pads 50 and 52 by wire bonds 66 and 68 respectively.

The structure 10 illustrated in FIG. 1 is greatly simplified for the purposes of describing the principles of the invention, and should not be considered as limiting the scope thereof. Although only one chip 58 is shown as being mounted on the structure 10, any practical number of chips, dies, discrete components and other elements can be mounted on the structure 10 and interconnected with the conductors and vias.

A practical microelectronic circuit substrate structure embodying the invention can include any number of layers of conductor metallizations and dielectrics. The conductors 24, 28, 36, 50 and 52 symbolically represent metallization interconnect layers which in a practical application will each include large numbers of finely spaced conductors. Although copper is the preferred material for the conductors and vias, the invention is not so limited, and other electrical materials such as aluminum and nickel can be used if desired. Aluminum cannot be plated, but can be applied by sputtering or evaporation.

Figure 2:
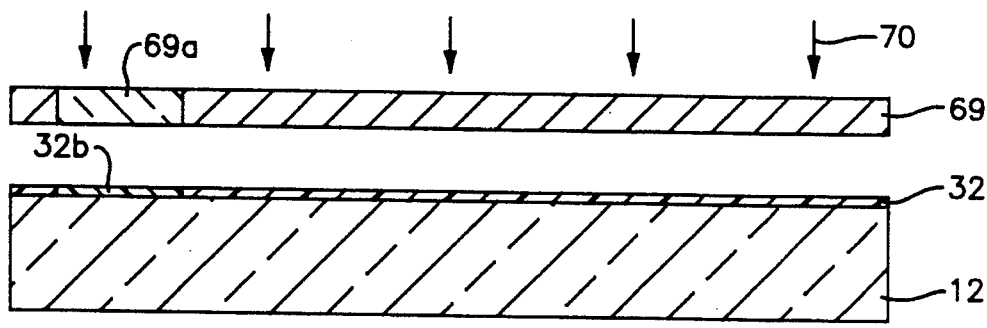
FIGS. 2 to 17 are simplified sectional views illustrating a method of fabricating the structure of FIG. 1.

A method of fabricating the structure 10 is illustrated in FIGS. 2 to 13. In FIG. 2, the metal ion containing dielectric layer 32 is coated on the substrate 12. The preferred coating method is curtain coating (a variation of extrusion coating), but the layer 32 can alternatively be applied by screen printing. An opaque mask or phototool 69 having a transparent area 69a is placed in contact with or closely adjacent to the layer 32.

The layer 32 is exposed through the phototool 69 by ultraviolet light as indicated by arrows 70 such that an area 32b under the transparent area 69a of the phototool 69 is irradiated with ultraviolet light. This causes crosslinking of the epoxy material in the area 32b.

Figure 3:
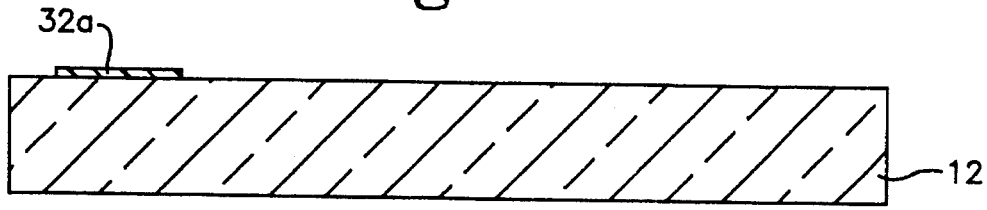

In FIG. 3, the phototool 69 is removed and the layer 32 is developed in an aqueous potassium or sodium carbonate solution (or a mild solvent depending on the material of the layer 32) followed by a warm water rinse to dissolve away the epoxy material except in the exposed area 32b to form the section 32a. The layer 32 is then soft baked at 70°90° C., thermally cured in a conveyorized furnace at 150° C.– 200° C. and ultraviolet cured.

Figure 4:
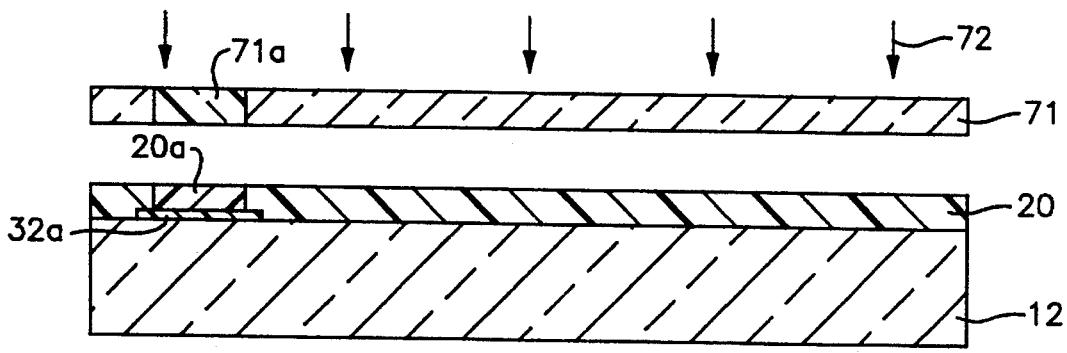

As illustrated in FIG. 4, the layer 20 is coated on the substrate 12 and section 32a of the layer 32, and a transparent mask or phototool 71 having an opaque area 71a is placed in contact with or closely adjacent to the layer 20. The layer 20 is exposed through the phototool 71 by ultraviolet light as indicated by arrows 72 such that the areas except for an area 20a under the opaque area 71a of the phototool 71 are irradiated with ultraviolet light. This causes cross-linking of the epoxy material except in the area 20a.

Figure 5:
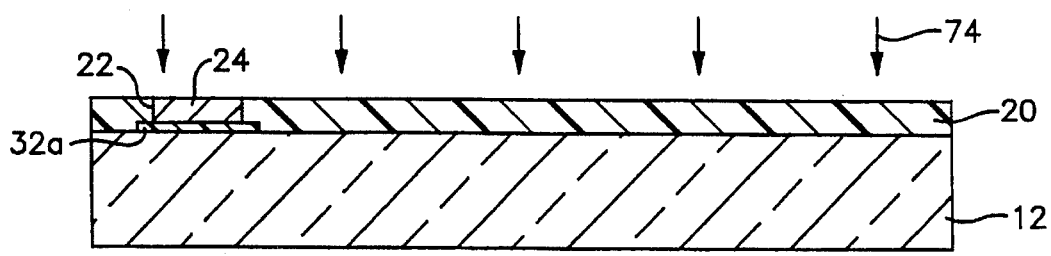

In FIG. 5, the phototool 71 is removed and the layer 20 is developed to dissolve away the epoxy material in the unexposed area 20a to form the hole 22. The layer 20 is then cured in the same manner as the layer 32. The conductor 24 is formed in the hole 22 by electroless plating of copper as indicated by arrows 74. Electroless plating is possible since the copper plates only on the section 32a of the metal ion containing layer 32 which is exposed in the bottom of the hole 22.

Electroless plating is known in the art per se as described in a textbook entitled "METALLIC COATING OF PLASTICS" by W Goldie, Vol 1, *Electrochemical Publications Ltd.*, Middelesex, England 1968, pp. 59–73.

Figure 6:
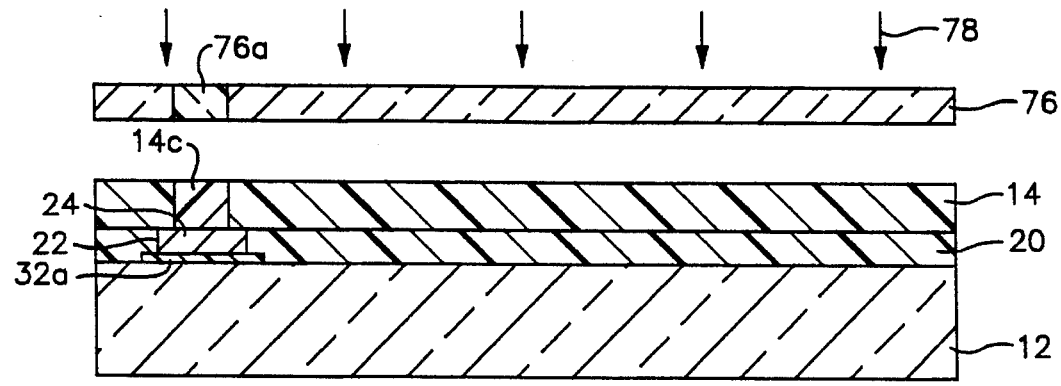
Figure 7:
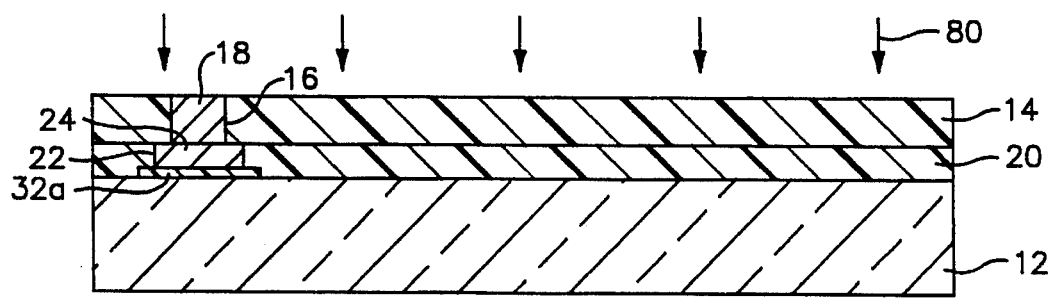

In FIG. 6, the dielectric layer 14 is formed on the layer 20, and photoimaged with ultraviolet light using a transparent phototool 76 having an opaque area 76a as indicated by arrows 78 to expose the layer 14 except in an area 14c. In FIG. 7, the phototool 76 is removed, and the layer 14 is developed and cured to form the via hole 16 which opens onto the conductor 24. The via 18 is formed in the hole 16 by electroless copper plating as indicated by arrows 80.

Figure 8:
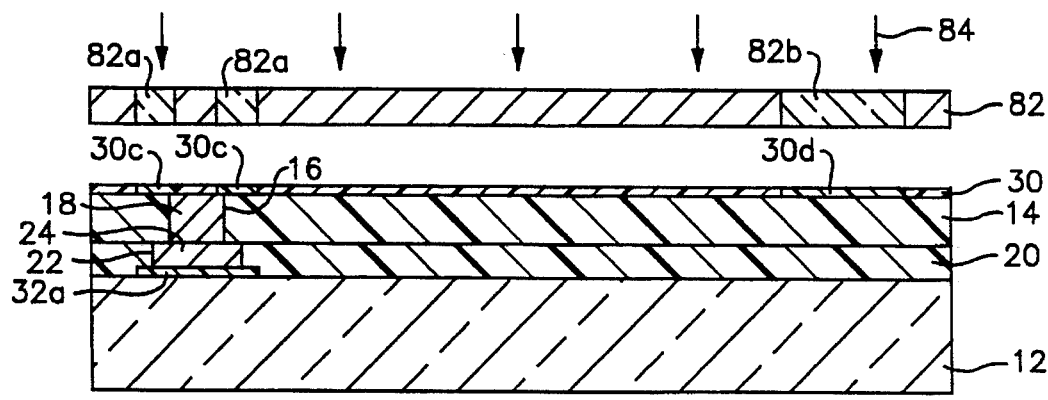

In FIG. 8, the ionized layer 30 is formed on the layer 14 and photoimaged using an opaque phototool 82 having an annular transparent area 82a and a circular transparent area 82b as indicated by arrows 84 to expose the layer 30 in an annular area 30c which is aligned with the via 18 and an area 30d which underlies the intended position of the conductor 36 respectively.

Figure 9:
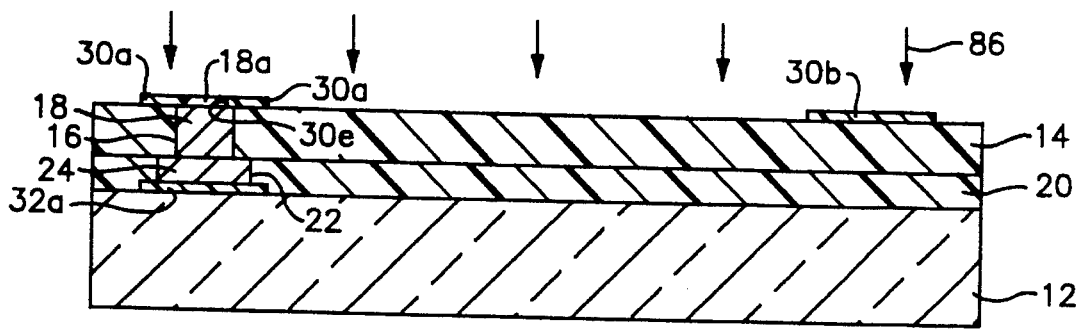

The layer 30 is developed and cured to form the section 30a having a secondary via hole 30e therethrough which is slightly smaller than the via hole 18 to allow for misalignment error. As illustrated in FIG. 9, a secondary via 18a is formed in the hole 30e by electroless plating which electrically communicates with and constitutes an extension of the via 18 as indicated by arrows 86.

Figure 10:
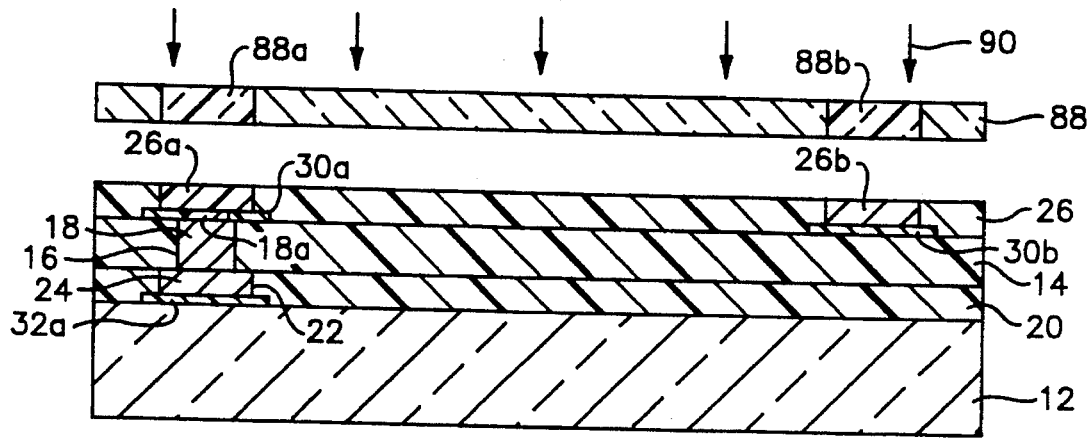

As illustrated in FIG. 10, the dielectric layer 26 is coated on the layer 30 and exposed using a transparent phototool 88 having opaque areas 88a and 88b as indicated by arrows 90 to expose the layer 26 except in areas 26a and 26b. The layer 26 is developed and cured to form the holes 27 and 34 respectively.

Figure 11:
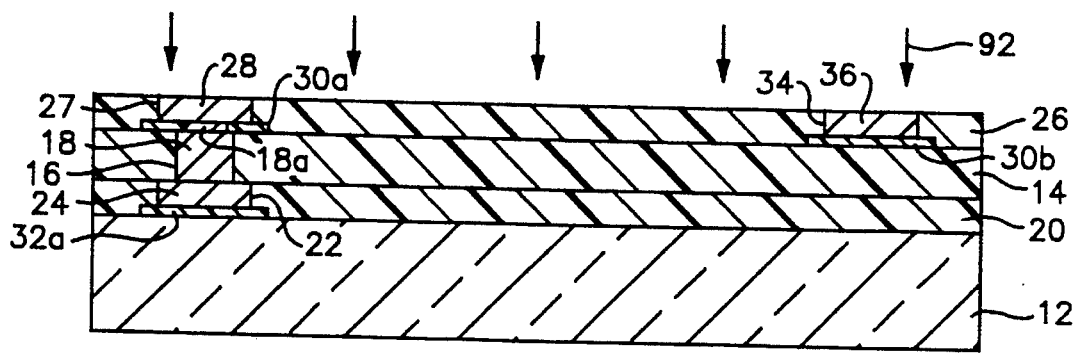

In FIG. 11, the catch pad 28 and conductor 36 are formed in the holes 27 and 34 by electroless plating as indicated by arrows 92 such that the catch pad 28 and conductor 24 are electrically interconnected by the via 18. Electroless plating is possible since the copper adheres to the sections 30a and 30b of the ionized layer 30 which is exposed in the bottoms of the holes 27 and 34.

It will be understood that the invention is not limited to the simplified embodiment shown, and that any number of additional layers, conductors and vias can be formed using the steps illustrated in FIGS. 2 to 11.

Figure 12:
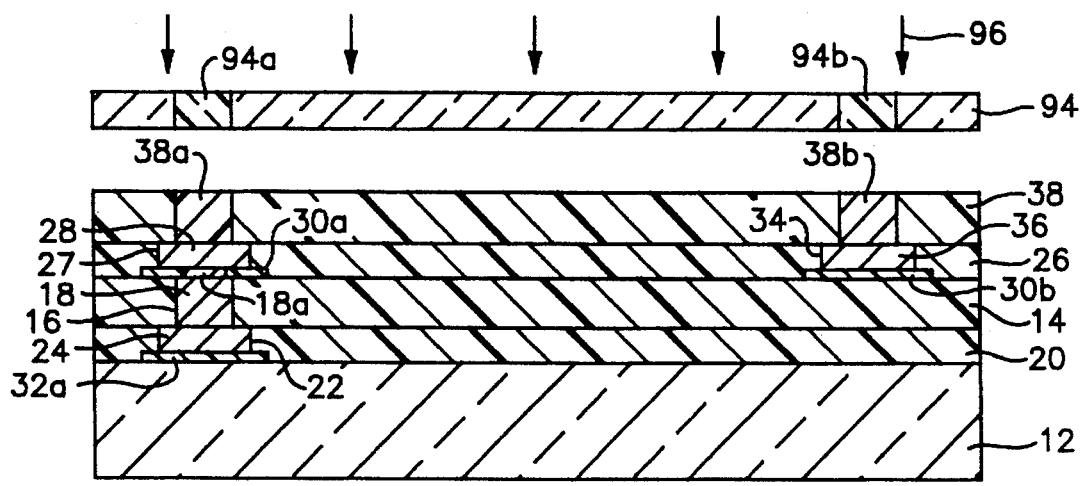
Figure 13:
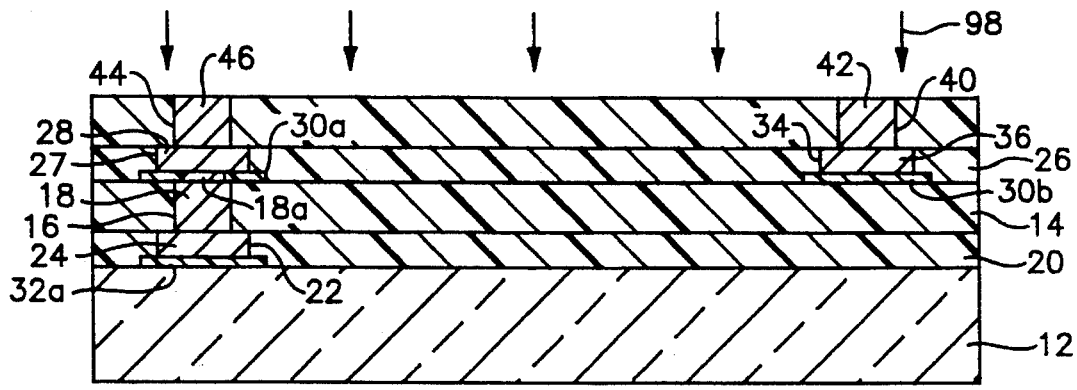

In FIG. 12, the dielectric layer 38 is formed on the layer 26, and photoimaged with ultraviolet light using a transparent phototool 94 having opaque areas 94a and 94b as indicated by arrows 96 to expose the layer 14 except in areas 38a and 38b respectively. In FIG. 13, the phototool 94 is removed, and the layer 38 is developed and cured to form the via holes 44 and 42 which open onto the catch pad 28 and the conductor 36 respectively. The vias 46 and 42 are formed in the holes 44 and 40 respectively by electroless nickel plating as indicated by arrows 98.

Figure 14:
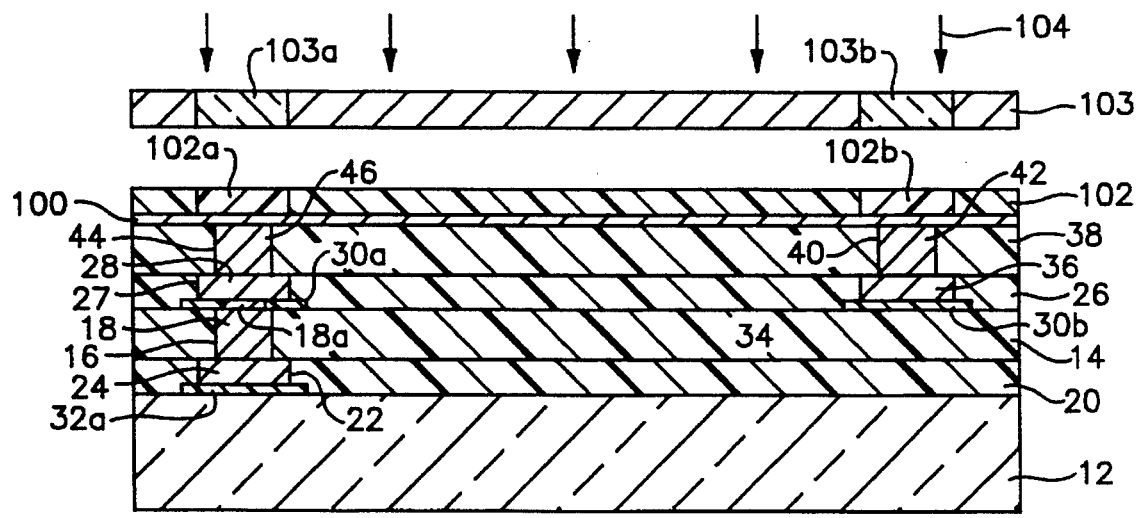

As illustrated in FIG. 14 to 17, the contact pads 50 and 52 are preferably formed on the dielectric layer 38 using a process known in the art as "pattern plating". In FIG. 14, a thin blanket layer 100 of nickel and gold is formed on the dielectric layer 38, and a positive photoresist layer 102 is formed on the layer 100. The layer 102 is photoimaged with ultraviolet light using an opaque phototool 103 having transparent areas 103a and 103b as indicated by arrows 104 to expose the layer 102 except in areas 102a and 102b respectively.

Figure 15:
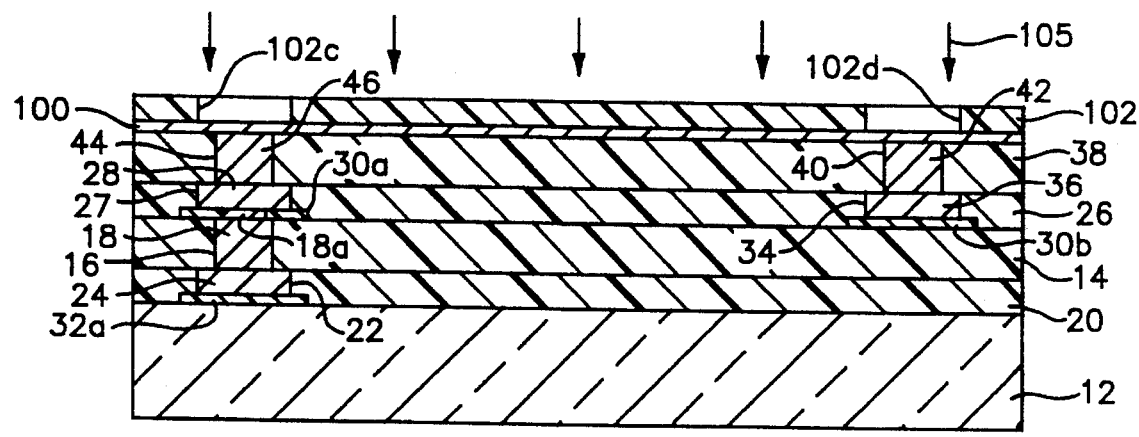

In FIG. 15, the phototool 103 is removed, and the layer 102 is developed and cured to form holes 102c and 102d which are aligned with the vias 46 and 42 respectively as indicated by arrows 105.

Figure 16:
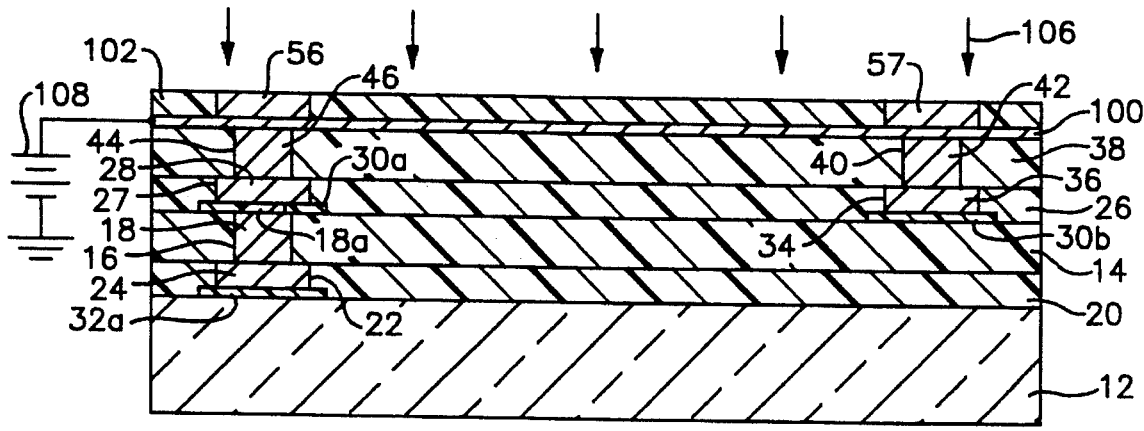

In FIG. 16, the conductor layers 56 and 57 are formed in the holes 102c and 102d by electroplating as indicated by arrows 106. The layer 100 is used as an electrode for electroplating, with an electrical potential being applied to the layer 100 by a power source such as a battery 108.

Figure 17:
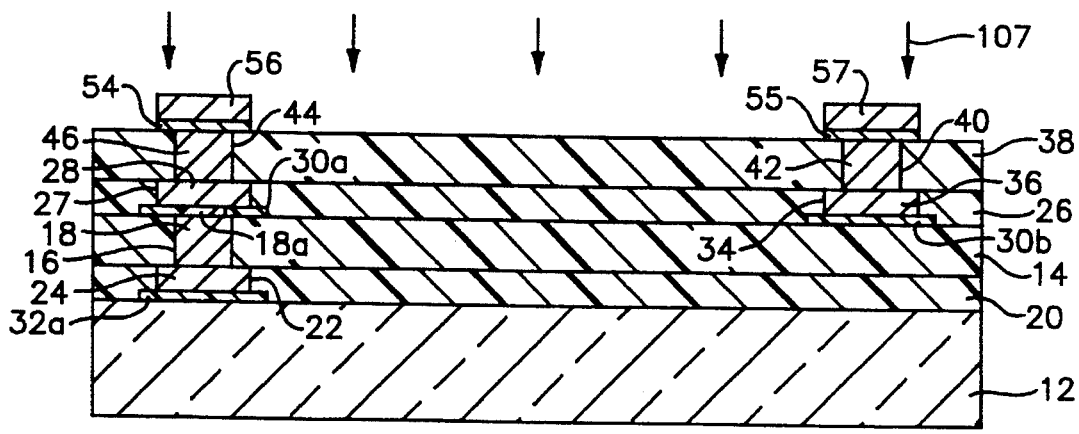

As indicated by arrows 107 in FIG. 17, the photoresist layer 102 is stripped away, and the layer 100 is etched away except under the layers 56 and 57 (using the layers 56 and 57 as an etching mask) to form the contact pads 50 and 52. The chip 58 is then adhered to the layer 38 using the adhesive 60, and interconnected to the conductor pads 50 and 52 with the wirebonds 66 and 68 respectively to form the structure 10 illustrated in FIG. 1.

The photoimageable epoxy material used for practicing the invention is currently an order of magnitude less expensive than the polyimide materials which are conventionally used as interlayer dielectrics in HDMIs, and can be directly patterned to form conductor and via holes in accordance with the invention.

This eliminates the photoresist coating and patterning steps which are required to form conductor lines and via holes in polyimide materials, and thereby enables the present fabrication method to be performed using a substantially smaller number of steps than the prior art.

The dielectric layers are applied by curtain coating or screen printing, and cured in air in a conveyorized furnace at a substantially lower temperature than polyimide materials, thereby eliminating the danger of stress induced damage as is present in the prior art. This reduces the curing time and increases throughput of the dielectric layers, and thereby the fabrication time of the HDMI structure by a considerable extent.

The electroless copper plating process used for forming the vias and conductor metallizations is a non-vacuum, high volume, high throughput process which can be precisely controlled and uses reliable equipment. The entire fabrication can be performed in a less costly cleanroom environment than is required for polyimide based HDMIs, thereby further reducing processing the time and cost.

The structure 10 is fabricated using additive photolithography, in which the dielectric layers, conductors and vias are formed using the same basic steps of photoimaging and developing epoxy material to form holes, and electroless plating metal into the holes. The steps of applying, imaging, developing and removing photoresist layers which are required for subtractive photolithography are not part of the method of fabricating the structure 10.

The layers of the structure 10 are planar, with the conductors and vias being coextensive with the holes in which they are formed both laterally and vertically. This is highly advantageous in that it enables substantially unlimited stacking of vias. The planarized surface also makes assembly much easier. In the prior art, the necessity of staggering vias and locating bonding pads away from vias decreases density and increases design time.

Figure 18:
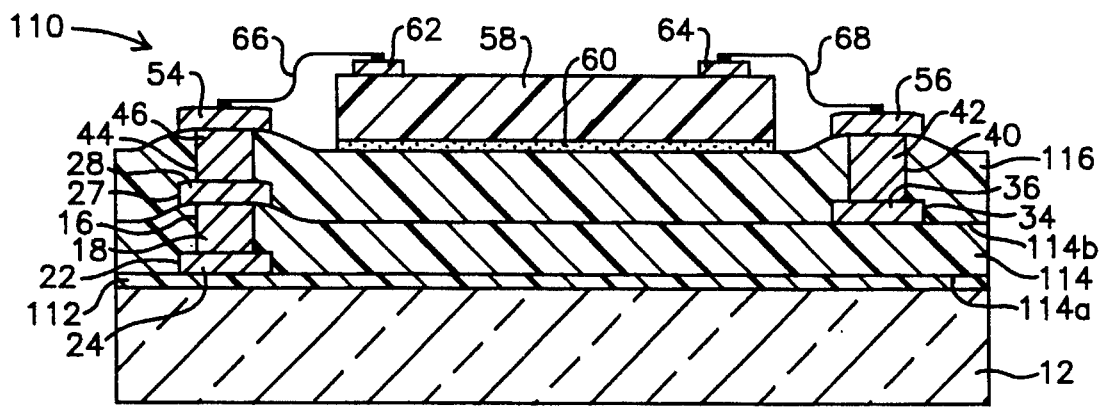
FIG. 18 is a simplified sectional view illustrating a second embodiment of a microelectronic circuit substrate structure embodying the present invention.

FIG. 18 illustrates another microelectronic circuit substrate structure 110 embodying the present invention which includes the same conductors and vias as the structure 10. However, the structure 110 is fabricated using an alternative method including both additive and subtractive photolithographic steps, and each dielectric layer can have both a conductor and a via formed therein. More specifically, the vias are formed using additive photolithography as in the structure 10, whereas the conductors are formed using subtractive photolithography.

The structure 110 comprises the substrate 12, and a planarizing layer 112 of photoimageable epoxy material or other dielectric material formed on the substrate 12. A first dielectric layer 114 of photoimageable epoxy material is formed on the planarizing layer, and has a lower first surface 114a and an upper second surface 114b.

The inner walls of the hole 22 constitute a portion of the first surface 114a, and the first conductor 24 is formed in the hole 22. The via hole 16 extends from the conductor 24 through the layer 114 to the second surface 114b, and the via 18 is formed in the hole 16.

A second layer 116 of photoimageable epoxy material is formed on the layer 114. The inner walls of the holes 27 and 34 constitute portions of the lower surface of the layer 116, with the hole 27 being aligned with the via 18. The second conductor or catch pad 28 is formed in the hole 27, and the conductor 36 is formed in the hole 34.

The via holes 40 and 44 extend from the conductor 36 and the catch pad 28 respectively through the layer 116 to the upper surface thereof. The vias 42 and 46 are formed in the holes 40 and 44, and the conductors 54 and 56 are formed on the layer 116 in alignment with the vias 46 and 42 respectively.

Figure 19:
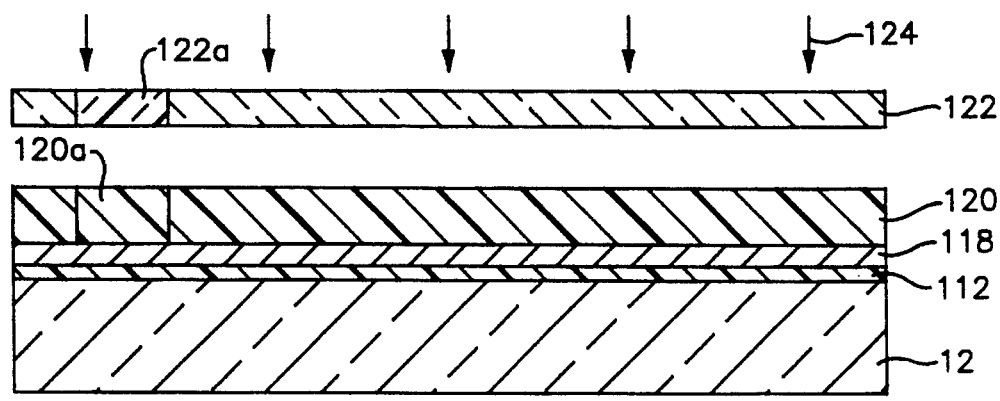
FIGS. 19 to 31 are simplified sectional views illustrating a method of fabricating the structure of FIG. 14.
Figure 20:
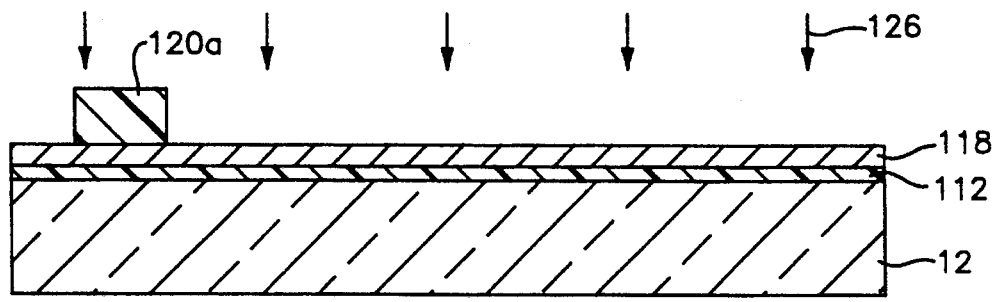

The method of fabricating the structure 110 is illustrated in FIGS. 19 to 31. In FIG. 19, the planarizing layer 112 and a copper layer 118 are formed on the substrate 12. The copper layer 118 is preferably formed by electroless plating, but can also be formed by sputtering or other suitable method. A positive photoresist layer 120 is formed on the copper layer 118.

A transparent phototool 122 having an opaque area 122a is placed in contact with or closely adjacent to the layer 120. Light of a suitable wavelength is used to photoimage the layer 120 as indicated by arrows 124 such that areas of the layer 120 except in an area 120a under the transparent area 122a of the phototool 122 are decomposed. The layer 120 is developed as indicated by arrows 126 in FIG. 20 to dissolve away the layer 120 except in the area 120a.

Figure 21:
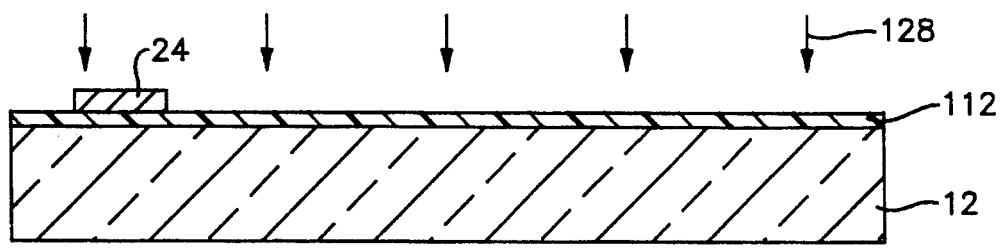

As indicated by arrows 128 in FIG. 21, the copper layer 118 is etched away except under the remaining area 120a of the photoresist layer 120, and the area 120a is removed to leave the conductor 24.

Figure 22:
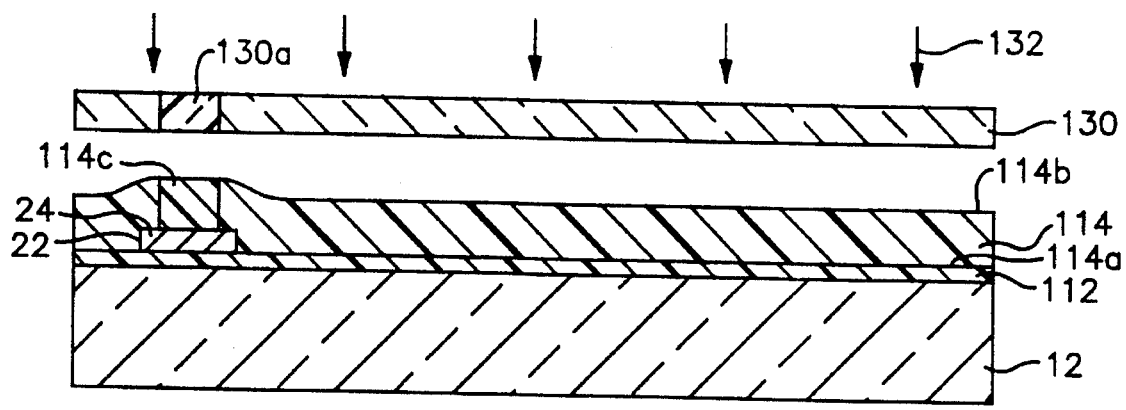

In FIG. 22, the layer 114 of photoimageable epoxy material is formed on the layer 112 and conductor 24 by extrusion or curtain coating, or screen printing. The hole 22 is defined in the lower surface 114a of the layer 114.

Figure 23:
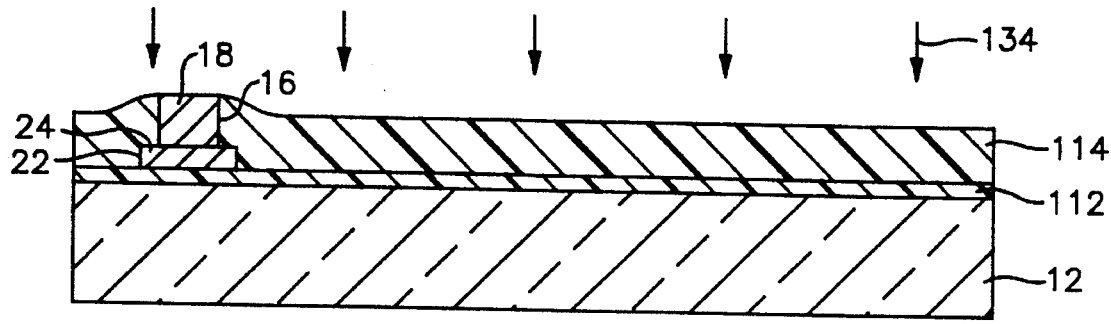

A transparent phototool 130 having an opaque area 130a is used to expose areas of the layer 114 except for an area 114c under the opaque area 130a of the phototool 130 as indicated by arrows 132. As illustrated in FIG. 23, the layer 114 is developed and cured to form the via hole 16, and the via 18 can be formed in the hole 16 by electroless copper plating as indicated by arrows 134.

Figure 24:
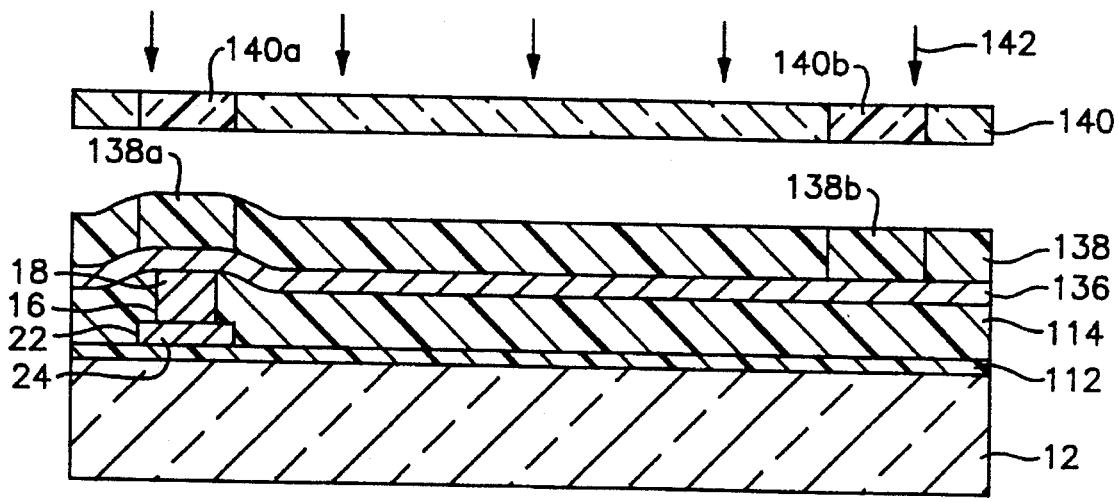
Figure 25:
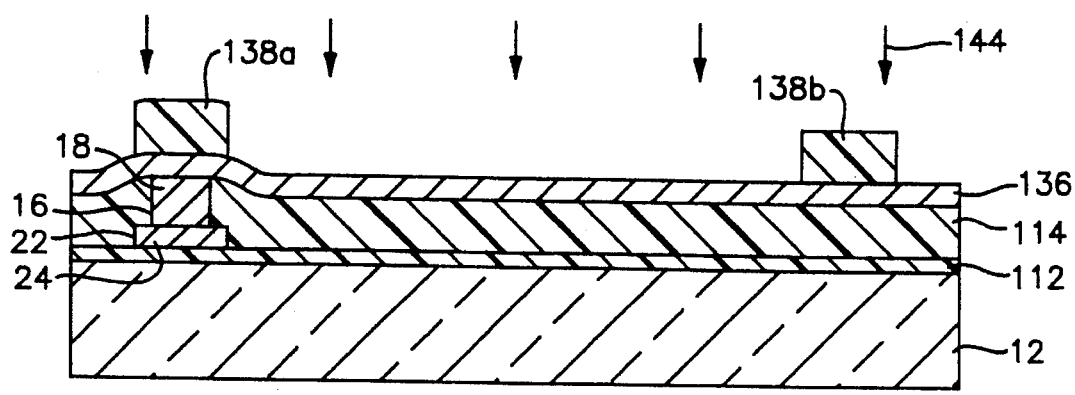

As illustrated in FIG. 24, a copper layer 136 is formed on the layer 114 in the same manner as the layer 118, and a positive photoresist layer 138 is formed on the copper layer 136. A transparent phototool 140 having opaque areas 140a and 140b is used to photoimage the layer 138 as indicated by arrows 142 except in areas 138a and 138b thereof. The layer 138 is developed as indicated by arrows 144 in FIG. 25 to dissolve away the layer 138 except in the unexposed areas 138a and 138b.

Figure 26:
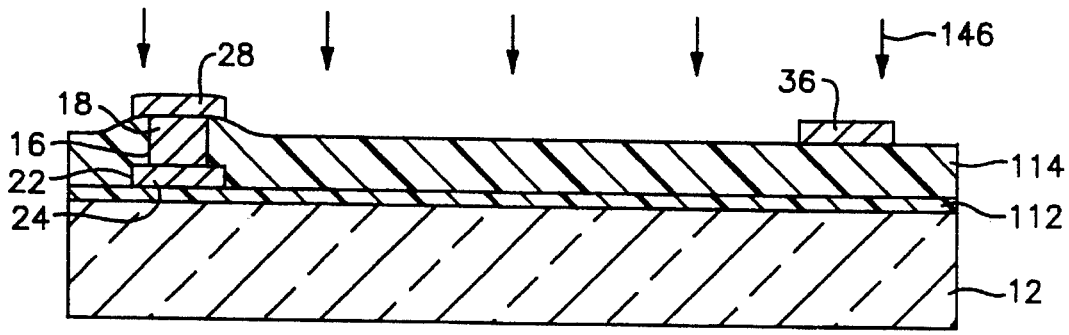

As indicated by arrows 146 in FIG. 26, the copper layer 136 is etched away except under the remaining areas 138a and 138b of the photoresist layer 138, and the areas 138a and 138b are removed to leave the catch pad 28 and conductor 36.

Figure 27:
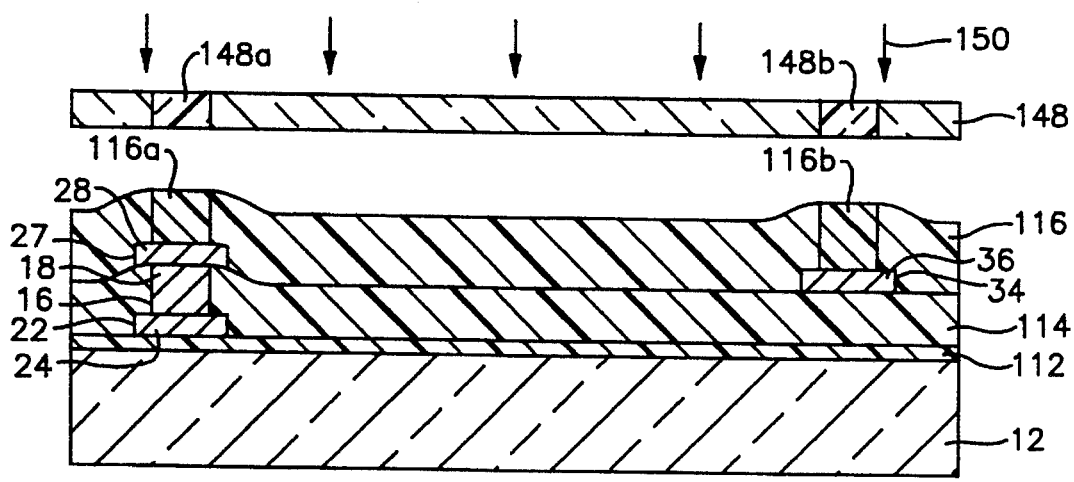

In FIG. 27, the layer 116 of photoimageable epoxy material is formed on the layer 114, catch pad 28 and conductor 36 by extrusion or curtain coating, or screen printing. An opaque phototool 148 having transparent areas 148a and 148b is used to expose the layer 116 in areas 116a and 116b as indicated by arrows 150. The holes 27 and 34 are defined as portions of the lower surface of the layer 116.

Figure 28:
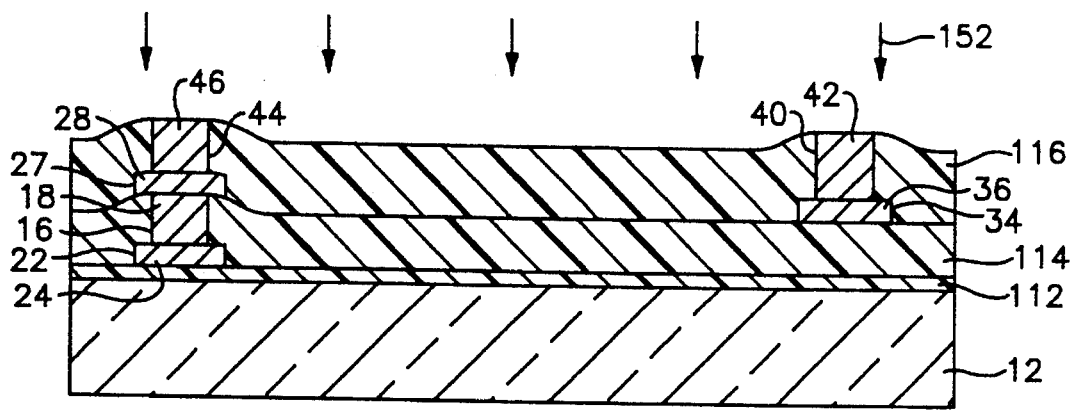

As illustrated in FIG. 28, the layer 116 is developed to form the via holes 40 and 44, and the vias 42 and 46 are formed in the holes 40 and 44 respectively by electroless copper plating as indicated by arrows 152.

Figure 29:
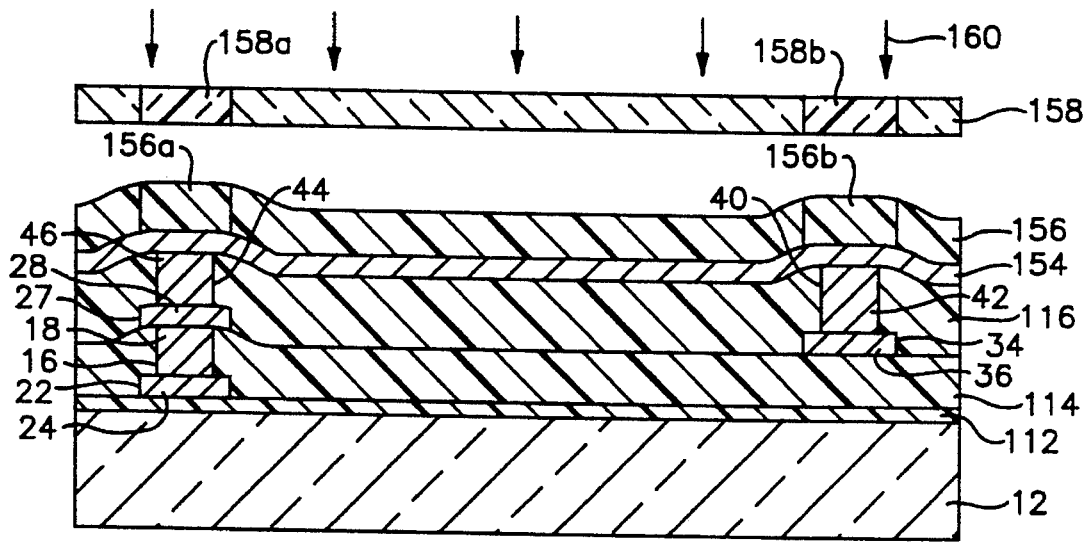
Figure 30:
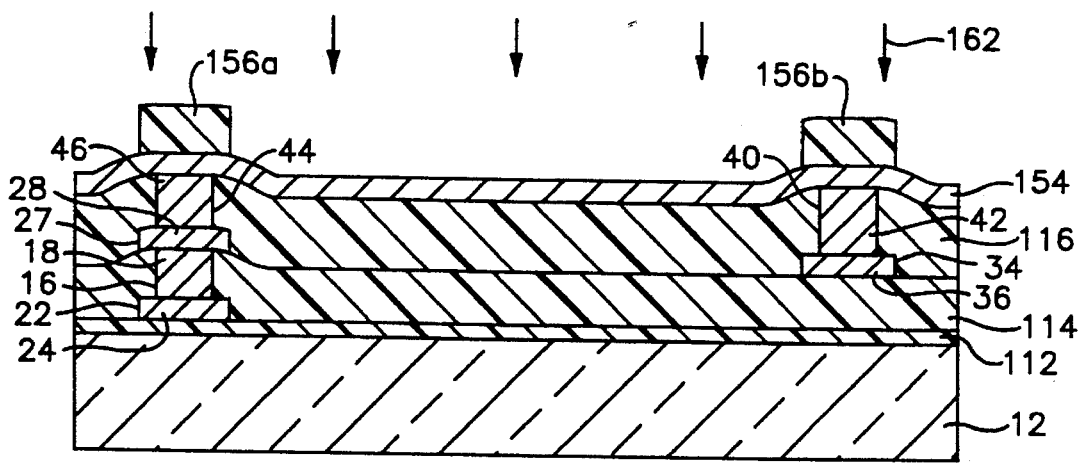

As illustrated in FIG. 29, a sputtered or electroless nickel/gold layer 154 is formed on the layer 116, and a positive photoresist layer 156 is formed on the layer 154. A transparent phototool 158 having opaque areas 158a and 158b is used to photoimage the layer 156 as indicated by arrows 160 except in areas 156a and 156b thereof. The layer 156 is developed as indicated by arrows 162 in FIG. 30 to dissolve away the layer 156 except in the unexposed areas 156a and 156b.

Figure 31:
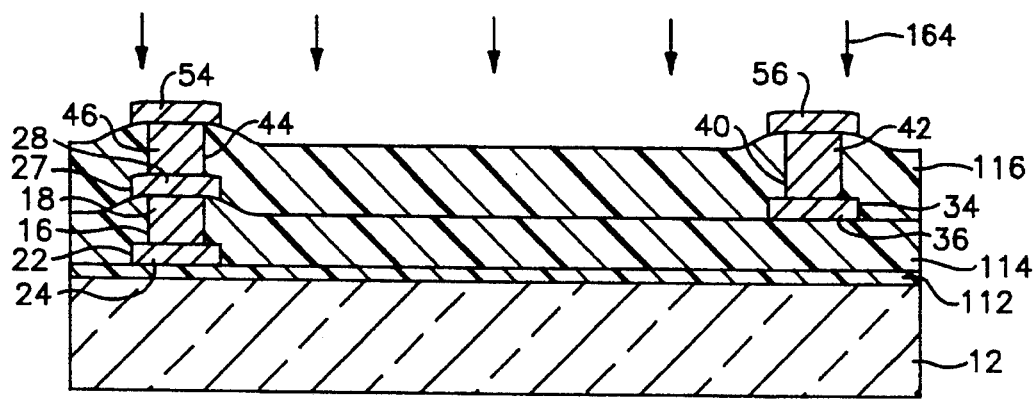

As indicated by arrows 164 in FIG. 31, the layer 154 is etched away except under the remaining areas 156a and 156b of the photoresist layer 156, and the areas 156a and 156b are removed to leave the conductors 54 and 56. The chip 58 is then adhered to the layer 116 using the adhesive 160, and the bond pads 62 and 64 of the chip 58 are interconnected with the conductors 54 and 56 respectively to form the structure 110 as illustrated in FIG. 14.

The structures 10 and 110 are designed for interconnection of chips and other components using wire bonding or similar methods. Gold bonding pads are required for wire bonding, involving substantial material cost.

Other interconnection methods are available which are advantageous in that they do not require gold bonding pads, and can be performed more quickly. Examples of such methods are flip-chip assembly and tape-automated-bonding (TAB).

Figure 32:
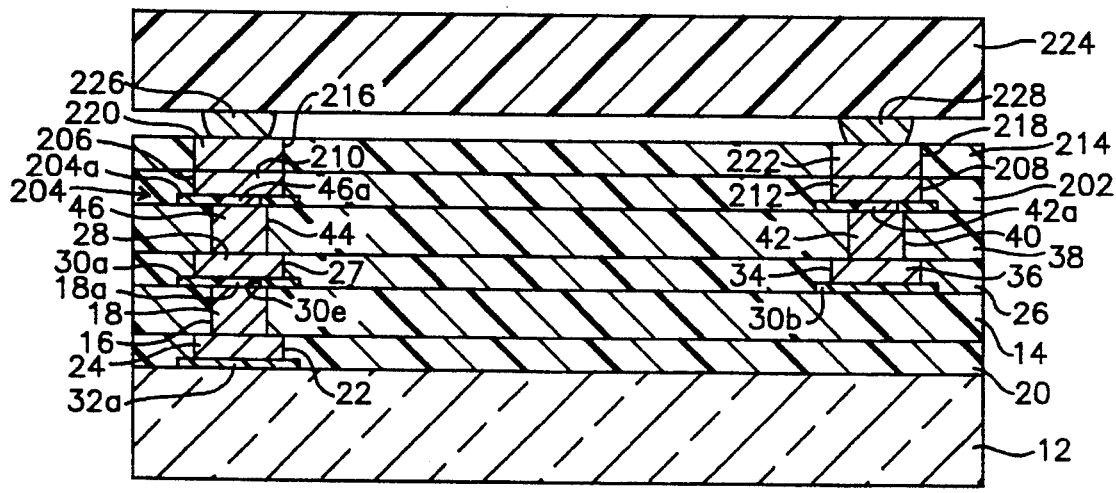
FIG. 32 is a simplified sectional view illustrating a third embodiment of a microelectronic circuit substrate structure embodying the present invention in a flip-chip configuration.

An HDMI microelectronic circuit substrate structure 200 embodying the present invention which is suitable for these interconnection methods is illustrated in FIG. 32. In addition to the elements common to the structure 10 of FIG. 1 which are designated by the same reference numerals, the structure 200 includes a dielectric layer 202 which is formed on the layer 38.

An annular section 204a of a metal ion containing dielectric layer 204 having a secondary via 46a formed in a central hole thereof overlies the via 46, whereas an annular section 204b of the layer 204 having a secondary via 42a formed in a central hole thereof overlies the via 42.

Holes 206 and 208 are formed in the layer 202 overlying the sections 204a and 204b respectively. Electroless copper conductors 210 and 212 are formed in the holes 206 and 208 respectively.

Another dielectric layer 214 is formed on the layer 202, and has holes 216 and 218 therethrough which open onto the conductors 210 and 212 respectively. Conductors 220 and 222 which consist of solder are formed in the holes 216 and 218 respectively.

A microelectronic integrated circuit chip 224 having a "flip-chip" configuration is mounted upside-down on the layer 214. More specifically, the chip 224 has electrically conductive bumps 226 and 228 which are ohmically connected to the solder conductors 220 and 222 respectively. During fabrication, the chip 224 is positioned on the layer 214, and the assembly is heated to cause the solder of the conductors 220 and 222 to reflow and bond to the bumps 226 and 228 as is conventional in flip-chip interconnection processing.

Figure 33:
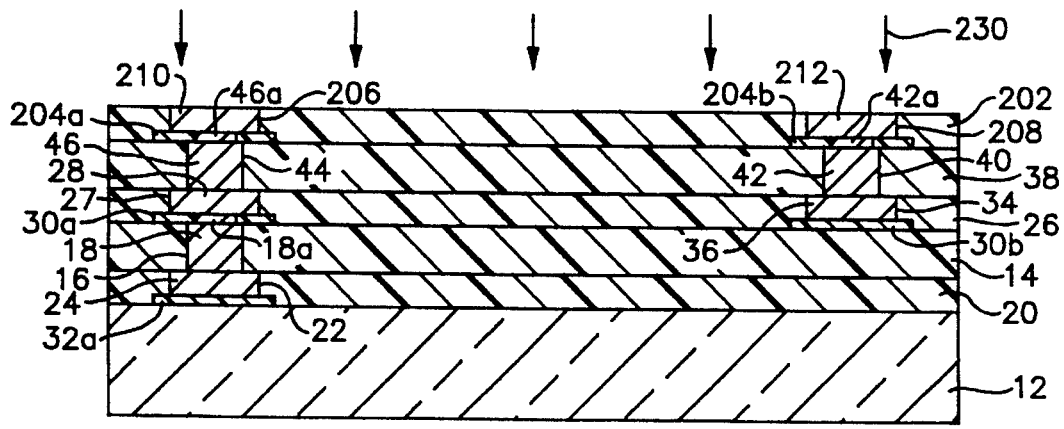
FIGS. 33 to 35 are simplified sectional views illustrating a method of fabricating the structure of FIG. 32.
Figure 34:
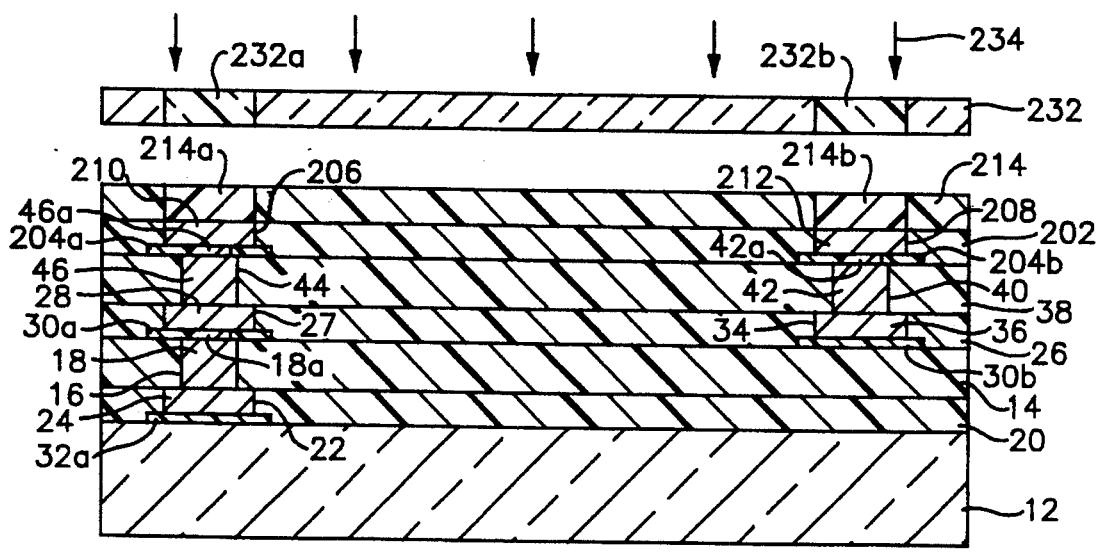
Figure 35:
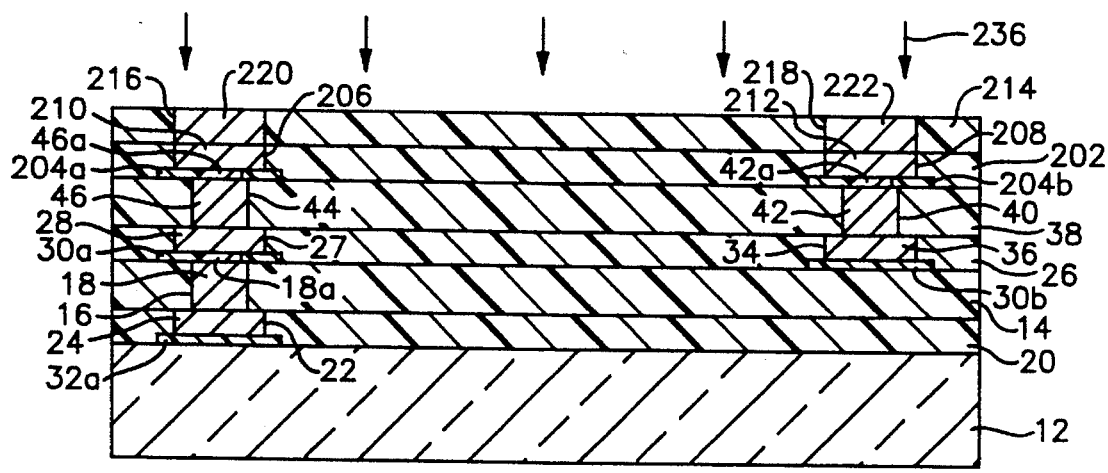

The method of fabricating the structure 200 is illustrated in FIGS. 33 to 35. In FIG. 33, the substrate 12, layers 14, 20, 26 and 38, and the conductors and vias buried therein are fabricated as illustrated in FIGS. 2 to 13. The layer 202, sections 204a and 204b and conductors 210 and 212 are formed using the steps described with reference to FIGS. 8 to 11 as indicated by arrows 230.

In FIG. 34, the dielectric layer 214 is formed on the layer 202 and photoimaged using a transparent phototool 232 having opaque areas 232a and 232b to expose the layer 214 except in areas 214a and 214b as indicated by arrows 234. The layer 214 is then developed as illustrated in FIG. 35 to form the holes 216 and 218, and the holes 216 and 218 are filled with solder to form the conductors 220 and 222 respectively using the layer 214 as a solder mask as described in the above referenced article to Bullock. The chip 224 is then mounted and interconnected to form the structure 200 illustrated in FIG. 32.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A microelectronic substrate structure, comprising:

an electrically conductive substrate having a first patterned epoxy material containing metal ions formed thereon;

a first dielectric layer of a photoimageable epoxy material having first and second opposite surfaces and a first via hole;

a second dielectric layer adjacent to said electrically conductive substrate and said first surface of said first dielectric layer, said second dielectric layer having a first through hole that is aligned with said first patterned material and adjacent to and having a larger diameter than said first via hole;

a first electrical conductor electrolessly plated on said first patterned material in said first through hole of said second dielectric layer;

an electrically conductive via formed in said first via hole, extending through said first dielectric layer and interconnecting with said first electrical conductor;

a second patterned epoxy material containing metal ions on said second surface of said first dielectric layer aligned with said electrically conductive via; and a second electrical conductor electrolessly plated on said second patterned material such that said first electrical conductor electrically interconnects with said second electrical conductor through said electrically conductive via and said first and said second patterned materials.

2. A structure as in claim 1, wherein said second dielectric layer is made of a photoimageable epoxy material which is formed on said electrically conductive substrate; and the structure further comprises:

a third dielectric layer of a photoimageable epoxy material which is formed on said second surface of the first dielectric layer and has a second through hole formed therethrough that is aligned with said second patterned material; in which said second through hole has a larger diameter than said first via hole; and said second electrical conductor is formed in said second through hole.

3. A structure as in claim 1, in which said first patterned material comprises a dielectric photoimageable epoxy material; and an electrically conductive metal ion additive to enable electroless plating of said first electrical conductor.

4. A structure as in claim 1, in which said first patterned material comprises a layer of dielectric photoimageable epoxy material coated with a thin electrically conductive metal ion layer to enable electroless plating of said first electrical conductor.

5. A structure as in claim 2, in which:

the first electrical conductor is substantially coextensive with the first through hole; and the second electrical conductor is substantially coextensive with the second through hole.

6. A structure as in claim 1, in which said photoimageable epoxy material is selected from the group consisting of ultraviolet sensitive cycloaliphatic epoxies and epoxy-acrylates.

7. A structure as in claim 1, in which said photoimageable epoxy material has a dielectric constant between approximately 2.7 and 4.0.

* * * * *